(12) United States Patent
Campbell et al.

(10) Patent No.: US 7,366,030 B2
(45) Date of Patent: Apr. 29, 2008

(54) SIMULTANEOUS READ CIRCUIT FOR MULTIPLE MEMORY CELLS

(75) Inventors: Kristy A. Campbell, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 705 days.

(21) Appl. No.: 10/766,010

(22) Filed: Jan. 29, 2004

(65) Prior Publication Data
US 2005/0265082 A1 Dec. 1, 2005

(51) Int. Cl.
*G11C 7/00* (2006.01)
(52) U.S. Cl. .................. 365/189.01; 365/157; 365/158
(58) Field of Classification Search ................ 365/106, 365/109, 112, 113, 157
See application file for complete search history.

(56) References Cited

U.S. PATENT DOCUMENTS

| | | | |
|---|---|---|---|
| 5,299,165 A * | 3/1994 | Kimura et al. ............. 365/210 |
| 5,530,263 A | 6/1996 | DiVincenzo | |
| 5,792,330 A | 8/1998 | Petersen et al. | |
| 5,905,673 A * | 5/1999 | Khan ..................... 365/185.03 |
| 6,052,519 A | 4/2000 | Gates et al. | |
| 6,061,265 A | 5/2000 | Hannah | |
| 6,208,553 B1 * | 3/2001 | Gryko et al. ................ 365/151 |
| 6,212,093 B1 | 4/2001 | Lindsey | |
| 6,218,718 B1 | 4/2001 | Gregg et al. | |
| 6,272,038 B1 | 8/2001 | Clausen et al. | |
| 6,304,481 B1 | 10/2001 | Hurt | |
| 6,324,091 B1 | 11/2001 | Gryko et al. | |
| 6,341,084 B2 * | 1/2002 | Numata et al. ............. 365/158 |
| 6,381,169 B1 | 4/2002 | Bocian et al. | |
| 6,451,942 B1 | 9/2002 | Li et al. | |
| 6,614,686 B1 * | 9/2003 | Kawamura ............. 365/185.12 |
| 6,678,200 B2 * | 1/2004 | Perner ........................ 365/209 |
| 6,707,715 B2 * | 3/2004 | Michael et al. ........ 365/185.18 |
| 7,105,864 B2 * | 9/2006 | Campbell et al. ........... 257/100 |

OTHER PUBLICATIONS

A. E. Botha et al.; "Electron-spin polarization in symmetric type-II quantum wells from bulk inversion asymmetry" The American Physical Society, Physical Review B67, 195334 pp. 1-8 (2003).

Kristy A. Campbell., et al.; "Parallel Polarization EPR Characterization of the Mn(III) Center of Oxidized Manganese Superoxide Dismutase" J. Am. Chem. Soc., 121, pp. 4714-4715 (1999).

Shunichi Fukuzumi, et al.; "Photochemical and Electrochemical Properties of Zinc Chlorin—$C_{60}$ Dyad as Compared to Corresponding Free-Base Chlorin—$C_{60}$, Free-Base Porphyrin—$C_{60}$, and Zinc Porphyrin—$C_{60}$ Dyads" J. Am. Chem. Soc., 123, pp. 10676-10683, (2001).

(Continued)

*Primary Examiner*—Tan T. Nguyen
(74) *Attorney, Agent, or Firm*—Dickstein Shapiro LLP (57) ABSTRACT

A memory device including a simultaneous read circuit design for multiple memory cells on a single interconnect using a fast fourier transform analysis circuit. The simultaneous read circuit can be used with any memory type storing information as an energy-absorbing state.

44 Claims, 6 Drawing Sheets

OTHER PUBLICATIONS

L. B. Glebov, et al.; "Magneto-induced microwave conductivity in $Mn^{2+}$—doped silicate glass" Journal of Non-Crystalline Solids 265, pp. 181-184, (2000).

O. Kahn, et al.; "Spin—Transition Polymers: From Molecular Materials Toward Memory Devices", Science, vol. 279, pp. 44-48 (Jan. 2, 1998).

Fatih Kocer, et al.; "A New Approach In NanoScale Electronics: Spin-FET (Field Effect Transistor) and Spin-Based Memory Architectures,"<www.personal.engine.unich.edu/wpualized/spin.pdf> (accessed prior to Jan. 29, 2004).

Yuji Kubo, et al.; "Chirality-Transfer Control Using a Heterotopic Zinc (II) Porphyrin Dimer," J. Am. Chem. Soc. 123, pp. 12700-12701, (2001).

Physics Laboratory, "Fourier-Transform Microwave Spectroscopy for Chemical Analysis," <http://physics.nist.gov/Divisions/Div844/facilities/ftmw/ftmw.html> (accessed Feb. 24, 2003).

Qiliang Li; "Capacitance and conductance characterizaation of ferrocene-containing self-assembled monolayers on silicon surfaces for memory applications," Applied Physics Letters, vol. 81, No. 8, pp. 1494-1496, (Aug. 19, 2002).

Paul A. Liddell, et al.; "Photonic Switching of Photoinduced Electron Transfer in a Dithlenylethene-Porphyrin-fullerene Triad Molecule," J. Am. Chem. Soc. 124, pp. 7668-7669, (2002).

S.E. Lofland, et al.; "Giant microwave magneto-impedance in a single crystal of $La_{0.7}Sr_{0.3}MnO_3$: The effect of ferromagnetic antiresonance," J. Appl. Phys. 80(6), pp. 3592-3594, (Sep. 15, 1996).

S. Ludwig, et al.; "Direct Coupling of Magnetic Fields to Tunneling Systems in Glasses," Physical Review Letters, vol. 88, No. 7, pp. 075501-1-075501-4, (Feb. 18, 2002).

J.A. Majewski, et al.; "First principles study of spin-electronics: Zero-field spin-splitting in superlattices," <www.wsi.tu-muenchen.de/research/annual_reports/rep00/pdfs/24.pdf> (accessed prior to Jan. 29, 2004).

Ian J. McNaught, et al.; "Microwave Spectroscopy Tutor," <http://jchemed.chem.wisc.edu/JCESoft/Issues/Series_B/8B2/prog2-8B2.html> (accessed Feb. 24, 2003).

A.N. Medina, et al.; "Resonant microwave cavity response of amorphous ribbons," J. Appl. Phys. 79(8), pp. 5462-5464, (Apr. 15, 1996).

Ryo Miyamoto, et al.; "Interplanar interactions in the triplet dimmers of Zn and metal free complexes of crowned porphyrin and phthalocyanine studied by time-resolved electron paramagnetic resonance," Coordination Chemistry Reviews, 132, pp. 57-62, (1994).

P. Giri Prakash, et al.; "EPR and optical absorption of $Mn^{2+}$ ions in alkali borotellurite glasses," Modern Physics letters B, vol. 16, Nos. 5 & 6, pp. 143-159, World Scientific Publishing Company, (2002).

R.R. Rakhimov, et al.; "Microwave response near zero magnetic field in transition-metal-doped silicate glasses," Applied Physics Letters, vol. 76, No. 6, pp. 751-753, (Feb. 7, 2000).

John Robblee; "Electron Paramagnetic Resonance" Berkeley Spectroscopy Club, <http://spectroscopy.161.gov/EPR-Robblee.pdf> (accessed Apr. 18, 2001).

M.A.Rowe, et al.; "A Hyperfine Measurement in Laser Trapped Radioactive $^{21}Na$," <http://weak0. physics.berkeley.edu/weakint/annual.reports/1997/21Na.NSD1997.pdf > (accessed prior to Jan. 29, 2004).

Pouya Valizadeh; "New Approaches in Spin-Electronics: High current gain spin-based HBT and Memory application for the spin-FET," III-V Integrated Circuits and Devices Group, Solid-State Electronics Laboratory, University of Michigan, pub. date not known.

Sung Ik Yang et al.; "Interplay of Orbital Tuning and Linker Location in Controlling Electronic Communication in Porphyrin Arrays," American Chemical Society, pp. 4008-4018, (1999).

Dae Hwan Yoon, et al.; "Electrical Conduction through Linear Porphyrin Arrays," J. Am. Chem. Soc. 125, pp. 11062-11064, (Aug. 15, 2003).

Chemedu, "Crystal Field Theory" <http://chemed.chem.purdue.edu/genchem/topicreview/bp/ch12/crystal.html>, (accessed Jun. 23, 2003).

U. Wimona, "Crystal Field Theory (CFT), An Introduction," <http://wwwchem.uwimona.edu.jm;1104/courses/CFT.html> (accessed Jun. 23, 2003).

BioChem, "Electromagnetic Radiation," <http://biochem.unl.edu/ragsdale/EPRspectroscopy/sld002.html> (accessed Jul. 3, 2003).

Frontier Scientific, "Prophyrins," Frontier Scientific, <http://www.frontiersci.com/porphyrins.html> (accessed Nov. 15, 2003).

Net BioChem, "Porphyrins" HemeandIron, <http://www.porphyrin.net/Heme_iron/porphyrins/_porphymain.html> (accessed Nov. 15, 2003).

U. Wa, "Section 4: Metal-Ligand Interactions and Reactions of Coordinated Ligands," <http://www.chem.uwa.edu.au/enrolled_students/2nd_year_Chem_Inorg_Section/sect4/sect.> (accessed Jun. 23, 2003).

Univ. Arizona, "Microwave Spectroscopy," <http://www.chem.arizona.edu/faculty/kuko/research/mwspec/spectra/spectra.htm> (accessed Feb. 24, 2003).

BioChem, "The Mineral Perovskite," <http://mineral.galleries.com/minerals/oxides/perovvski/perovski.htm> (accessed Nov. 15, 2003).

BioChem, "Spin—Spin Interaction," <http://biochem.unl.edu/ragsdale/EPRspectroscopy/sld032.html> (accessed Jul. 16, 2003).

U. Alabama, <http://bama.ua.edu/Kshaughn/ch609/notes/3-legal survey> (accessed prior to Jan. 29, 2004).

* cited by examiner

SIMULTANEOUS READ CIRCUIT FOR MULTIPLE MEMORY CELLS

The invention disclosed in this application is related to the invention disclosed by U.S. patent application Ser. No. 10/765,911, filed concurrently with this application by Kristy A. Campbell, Terry L. Gilton, and John T. Moore, now issued as U.S. Pat. No. 7,105,864. The entirety of this related application and patent is hereby incorporated by reference herein in its entirety.

FIELD OF THE INVENTION

The invention relates to a read circuit for simultaneously reading a plurality of memory cells and to methods of making and using such a circuit.

BACKGROUND

Integrated circuit designers have always sought the ideal semiconductor memory: a device that is randomly accessible, can be written or read very quickly, is non-volatile, but indefinitely alterable, consumes little power, and is scalable. Emerging energy-absorption-related memories such as variable resistance memories increasingly offer these advantages. Programmable Conductance Random Access Memory (PCRAM) is one example of such a memory. Additionally, Magnetoresistive Random Access Memory (MRAM) technology has been viewed as offering all these advantages. Other types of variable resistance memories include polymer-based memory, chalcogenide-based memory, differential negative resistance (DNR) memory, and perskovite memory.

A PCRAM element has a structure including a chalcogenide-based glass region incorporating a metal (or metal ions) and electrodes on either side of the glass region. Information can be stored as a digital "1" or "0" as stable resistance states. A typical chalcogenide glass used in PCRAM devices is $Ge_xSe_{100-x}$. The chalcogenide glass can also be used in conjunction with layers of Ag and/or $Ag_2Se$. An example of a PCRAM device is described in U.S. Pat. No. 6,348,365 to Moore and Gilton. The glass region of a PCRAM element can be made less resistive upon application of a threshold voltage. This less resistive state is maintained in a non- or semi-volatile manner and is reversible by applying a reversed voltage. The resistance state of a PCRAM element can be sensed by the application of a sub-threshold voltage through the cell element.

A magnetic memory element has a structure which includes ferromagnetic layers separated by a non-magnetic barrier layer that forms a tunnel junction. An example of an MRAM device is described in U.S. Pat. No. 6,358,756 to Sandhu et al. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different stable resistance states, which are read by the memory circuit as either a "1" or a "0." Passing a current through the MRAM cell enables detection of the resistance states.

As mentioned above, polymer memory, another type of variable resistance memory, utilizes a polymer-based layer having ions dispersed therein or, alternatively, the ions may be in an adjacent layer. The polymer memory element is based on polar conductive polymer molecules. The polymer layer and ions are between two electrodes such that upon application of a voltage or electric field the ions migrate toward the negative electrode, thereby changing the resistivity of the memory cell. This altered resistivity can be sensed as a memory state.

Chalcogenide memory, another type of variable resistance memory, switches resitivity states by undergoing a phase change in response to resistive heating. The two phases corresponding to the two stable resistivity states include a polycrystalline state and an amorphous state. The amorphous state is a higher resistive state, which can be read as stored data.

DNR memory can be programmed to store information as an absolute DNR current maximum, thereby forming a memory element. The DNR memory element functions by storing data as separate, maintainable maximum current states, which are programmed when voltages are applied to the memory element. The observable DNR memory of such device is highly stable, repeatable, and predictable, making for an excellent memory device. An example of a DNR memory is described in U.S. patent application Ser. No. 10/410,567, filed Apr. 10, 2003, by Kristy A. Campbell.

Figure 5:
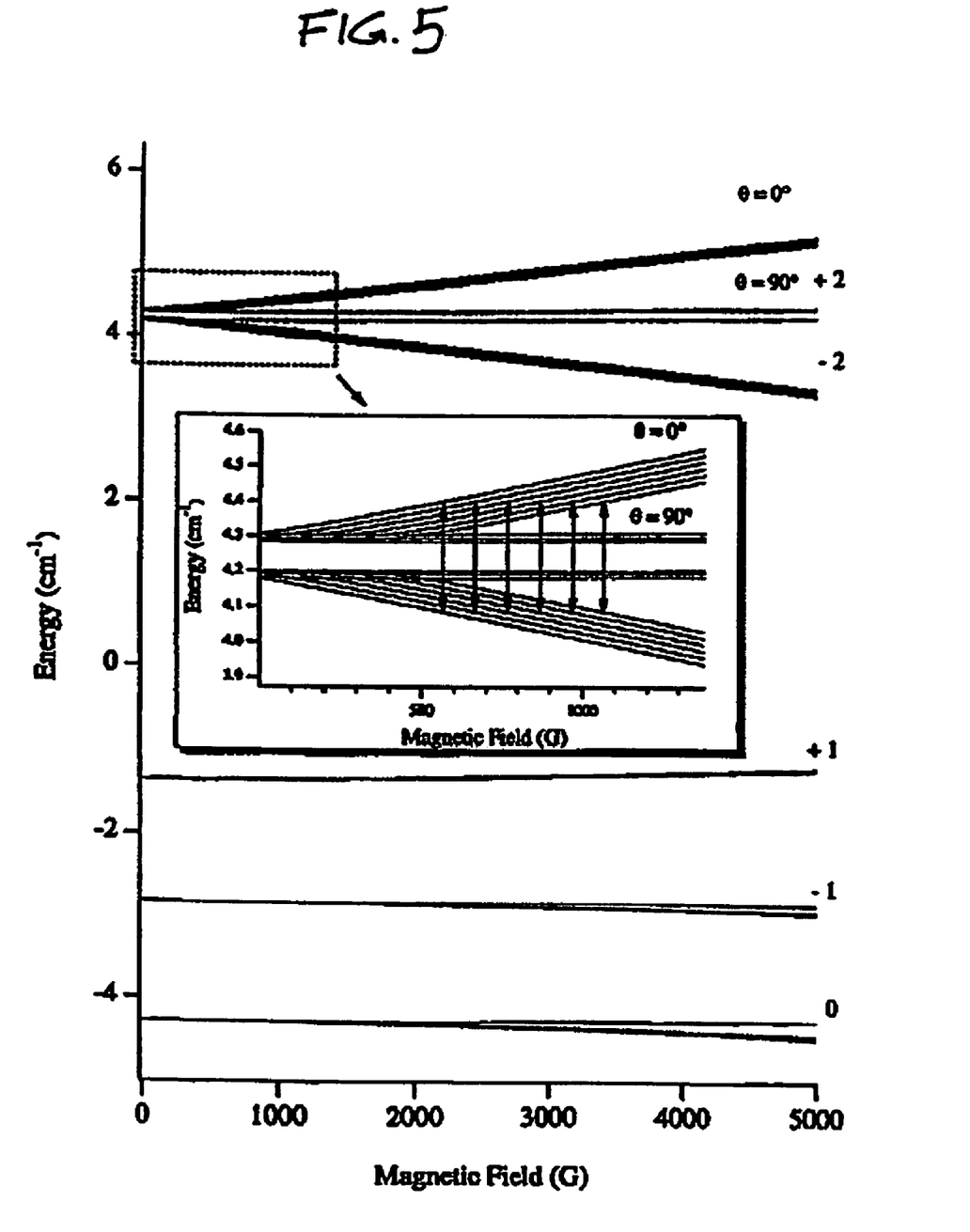
FIG. 5 is an energy level diagram of an S=2 system illustrating zero field splitting for a transition metal ion species.

The search for non-volatile memory devices has led to investigations into atomic-level properties of materials for switching and memory applications. Studies have been conducted into electron spin transistors and memory components. Even in the absence of a magnetic field, some materials exhibit splitting of the electron spin energy levels. This is referred to as zero field splitting. Zero field splitting is different from Zeeman splitting (i.e., separation of the electron spin energy levels in the presence of an externally applied magnetic field). The difference being that some molecules may exhibit splitting of the electron energy levels at zero externally applied magnetic field, due in part, to the natural crystal fields present around a metal ion (in the case of molecules with transition metal ions) or to spin-spin coupling within a molecule or between molecules. Molecules with transition metals (e.g., Mn, V, Fe, Co, Cr, Ni, Cu, Zn, Cd, and others) are quite frequently paramagnetic and may have electron spin energy levels at zero magnetic field with an energy splitting between levels for which a spin transition is allowed that is within a range detectable with microwave radiation. For example, as shown in FIG. 5, $Mn^{+3}$ ions have a spin system with an effective spin $S=2$, with a positive zero field splitting value. The inset portion of FIG. 5 is an expanded view of the $Ms=\pm 2$ energy levels in the region of observed parallel mode electron paramagnetic resonance transitions (indicated by the double arrows). Analytical techniques, such as microwave spectroscopy or electron paramagnetic resonance (EPR) spectroscopy can identify molecular systems that exhibit zero field splitting properties.

Spin-spin interactions occur when there is at least one unpaired electron interacting with another unpaired electron (S greater than or equal to 1, where S is the effective spin). An example molecular system that could give rise to this situation includes a molecule containing $Mn^{+3}$, which has a total spin $S=2$ (e.g., the molecule Mn(salen)). In this case, there are 4 unpaired electrons interacting with each other.

Microwave absorption spectroscopy has been used to identify atomic properties of chemical species. Microwave absorption has been shown to be a viable means of determining energy absorption at frequencies corresponding to the zero field splitting value of the absorbing material.

Each of the above-discussed memory types utilize some energy absorbing property for storing information. Also, each can utilize a two terminal memory cell having a memory storing region separating two electrodes, which can be set up in a cross-point or modified cross-point style memory array, if desired.

SUMMARY

An exemplary embodiment of the invention provides a simultaneous read circuit for low-volatility or non-volatile memory cells utilizing energy-absorption, particularly zero field splitting resonance, to store data. Although the invention applies to any type of memory using energy absorption properties to store information, the detailed description is primarily directed to zero field splitting resonance memory where the memory cells utilize a host material incorporating at least one metal ion species. The invention provides a circuit for simultaneously reading multiple memory cells, such as zero field splitting resonance memory cells, coupled to a single interconnect line in one operation using a fast fourier transform analysis circuit.

These and other features of exemplary embodiments of the invention will be more apparent from the following detailed description and drawings which illustrate the various embodiments.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including any foundation suitable for supporting a memory element of the invention. For example, the substrate can be silicon, silicon-on-insulator (SOI), silicon-on-sapphire (SOS), doped and undoped semiconductors, epitaxial layers of silicon supported by a base semiconductor foundation, and other semiconductor, conductor, or insulator structures. Furthermore, when reference is made to a "wafer" or "substrate" in the following description, previous process steps may have been utilized to form regions, junctions or material layers in or on the base structure or foundation. In addition, the semiconductor substrate need not be silicon-based, but could be based on silicon-germanium, germanium, gallium arsenide, or other known semiconductor materials. Further, the substrate need not be semiconductor-based at all, but can be any material suitable for supporting an integrated circuit memory structure, for instance, polymer, glass, metals, insulated metals, ceramics, and other materials.

The invention relates to a simultaneous read circuit incorporating a fast fourier transform analysis circuit, which is suitable for any memory type which utilizes an energy absorption property for storing information, such as PCRAM, MRAM, DNR memory, polymer memory, chalcogenide memory, and others. However, for exemplary purposes, the simultaneous read circuit of the invention will primarily be described as applied to a zero field splitting resonance memory type.

Zero field splitting memory utilizes properties of certain metal ions or matrix types to form memory cells, a plurality of which are interconnected by a fast fourier transform analysis circuit for simultaneous reading. Transition metal ions, such as ions of Co, Cr, Fe, Mn, Ti, Cu, Zn, V, Cd, and Ni, and others, are preferred and can be added to a host material, such as an organic molecular matrix or an inorganic matrix. The selection of the metal ions and the host material determines the zero field splitting energy; the host material may or may not play a role in the zero field splitting properties of the ions in memory operation. The selection of these ions and host materials should result in microwave absorption energies of about 0.03 $cm^{-1}$ to 3.3 $cm^{-1}$ at zero field to satisfy requirements for memory state sensing. In order for the zero field splitting energy absorption to be useful for memory purposes, an allowed spin transition according to the transition probability selection rules is necessary.

The separation of spin states in the metal ions within the host material at zero magnetic field should be small enough to be able to utilize the energy available on a standard semiconductor chip. The host material, if organic, can be polymer based or porphyrin based. If the host material is inorganic, it may be a chalcogenide glass, e.g., arsenic selenide or germanium selenide, a semiconductor, or silicate, for example.

Figure 1:
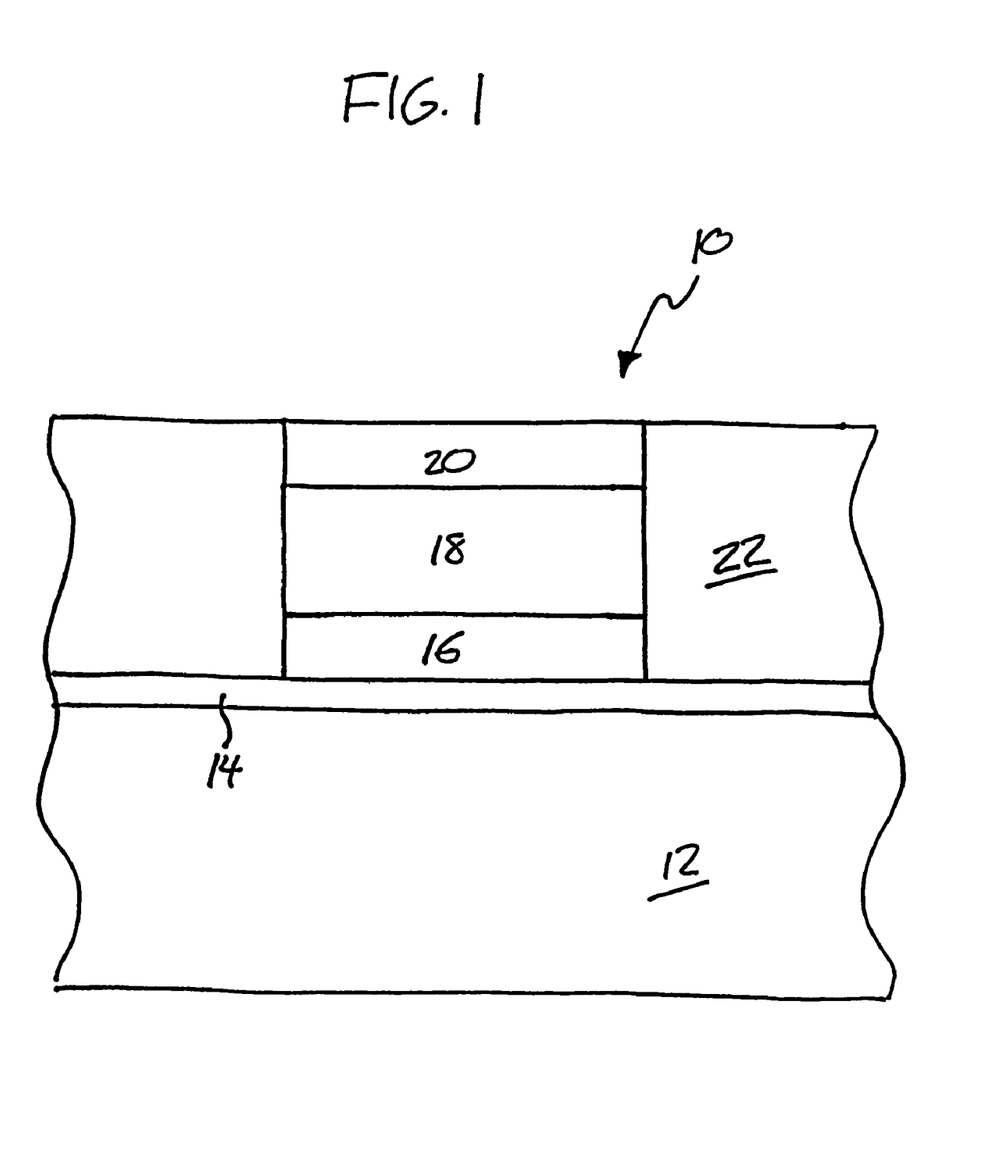
FIG. 1 is an illustration of a cross-section of a memory cell which may be used with the simultaneous read circuit in accordance with the invention.

Now referring to the figures, where like reference numbers designate like elements, FIG. 1 shows a simplified illustration of a specific memory cell construction in accordance with an exemplary embodiment of the invention. The memory cell 10 is shown as supported by a substrate 12, which may be silicon-based, but as indicated above, the substrate can be any of a number of materials. The substrate 12 can be formed or provided as is known in the art by conventional means, depending on its composition.

An optional insulating layer 14 is provided over the substrate 12 if it is semiconductor-based. The optional insulating layer 14 can be, for example, silicon oxide or silicon nitride, and can be formed by CVD (chemical vapor deposition), sputtering, oxidation of the substrate 12, or other known techniques.

Over the optional insulating layer 14, or substrate 12 if layer 14 is excluded, is provided an electrode 16 of a conductive material. The conductive material for the electrode 16 can be any of a number of materials, including, but not limited to tungsten, tungsten nitride, aluminum, copper, doped polysilicon, nickel, titanium, and platinum. The electrode 16 material can be deposited by CVD, PECVD (plasma enhanced chemical vapor deposition), sputtering, plating, or other known techniques, and the electrode 16 can thereafter be defined by patterning and etching, if desired.

Over and electrically coupled to the electrode 16 is deposited a layer of host material 18, which incorporates metal ions, such as Mn+2, for example. The host material 18 can be an organic or inorganic molecular matrix (as indicated above) and can be formed by blanket deposition techniques, which may be followed by patterning and etching if desired, or, alternatively, may be formed by an in-via process; either deposition process may include CVD, sputtering, co-sputtering, thermal evaporation, or other known techniques. The host material 18 can be about 100 Å to about 2,000 Å thick.

For example, one suitable and exemplary host material 18 is a $Ge_xSe_{100-x}$ glass, for example, a $Ge_{40}Se_{60}$ glass. Preferably, the glass and ions (e.g., $Mn^{+2}$ ions, which may be provided as MnSe) are deposited together by cosputtering or co-evaporation. In another method, the glass is first deposited, for example, by sputtering, and then a layer of ions is formed over the $Ge_{40}Se_{60}$ host material 18, for example, by sputtering or thermal evaporation. The ions can be incorporated into the host material 18 by photodoping or thermal diffusion, or by other means. If the host material 18 itself exhibits zero field splitting properties, the step of adding ions may be omitted.

Depending on the selection of host material 18 and metal ion pairing, the host material 18 can incorporate from less than about 0.3% to up to about 10% (by weight) metal ions. About 1 wt. % ion concentration is preferred.

A second electrode 20 is next deposited over the ion-doped host material 18. The second electrode 20 can be of the same or similar materials as the first electrode 16 and can be formed by the same or similar techniques. The memory device 10 stack can be surrounded by an insulating material 22, such as BPSG (borophosphosilicate glass) or polyimide, and the wafer can be planarized by CMP (chemical mechanical polishing) using the top electrode 20 as a stop, if desired. The memory device 10 shown in FIG. 1 is representative of one of a plurality of such devices that can be arranged in a memory array.

Figure 6:
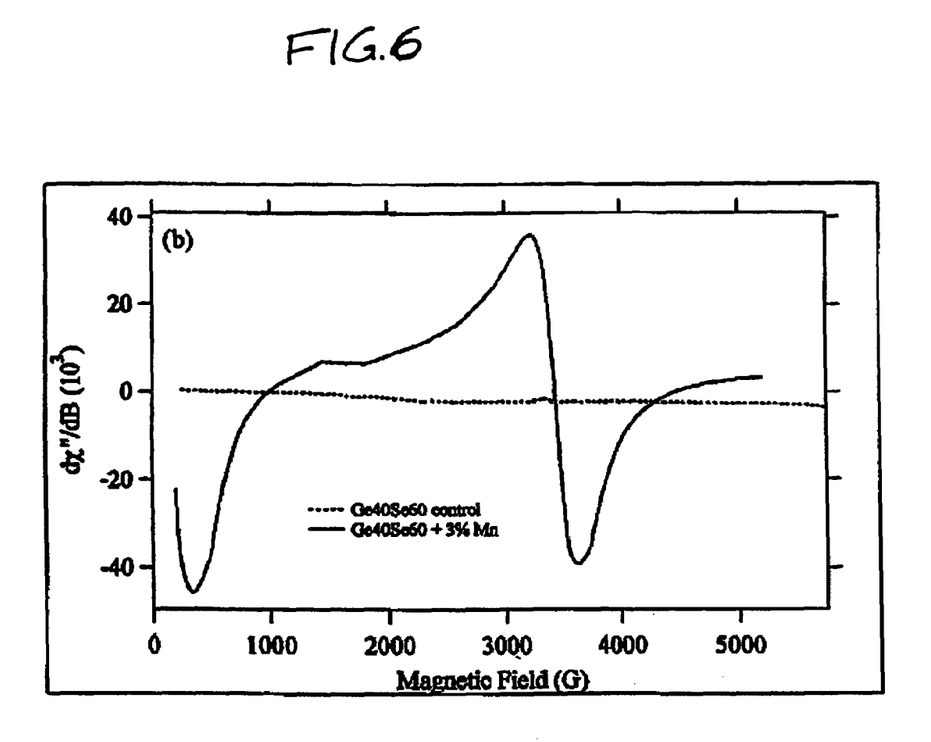
FIG. 6 is a graph showing the low field signal where zero field splitting may be observed in an exemplary embodiment of the invention.

The $Mn^{+2}$ ions in the above-described exemplary $Ge_{40}Se_{60}$ glass enable the host material 18 to display a relatively large microwave absorption at zero field, which enables the device to store data as energy absorption states. A memory device in accordance with this exemplary embodiment can absorb about 0.33 $cm^{-1}$ of energy of a potential pulse having a rise time of about 35 picoseconds and a frequency of about 9.68 GHz. As shown by the graph in FIG. 6, the zero field splitting absorption is observed at relatively low field signal in the structure of this embodiment. The germanium selenide stoichiometry plays a role in the functioning of this exemplary cell, with the $Ge_{40}Se_{60}$ glass being preferred over other germanium selenide stoichiometries. Other glass types and stoichiometries can be used in the inventions however.

In the embodiment discussed in the preceding paragraphs in relation to FIG. 1, the first electrode 16 can comprise manganese. The second electrode 20 can be tungsten. These electrodes 16 and 20 are not limited to such materials, however. Other conductive materials such as doped polysilicon, titanium, aluminum, copper, silver, platinum, nickel, and conductive nitrides can be used as well.

Other combinations of metal ions and host materials 18 can also be used for a memory device in accordance with the invention. As previously indicated, such combinations should be able to absorb a detectable amount of energy when in a programmed state. For example, a standard float glass doped with less than about 1% $Mn^{+2}$, $Mn^{+3}$, or $Fe^{+3}$ has been shown to absorb a detectable amount of energy in the microwave frequency range. Float glass can comprise $Na_2O$—$CaO$—$MgO$—$SiO_2$, and the metal ions can be incorporated into the glass as about 1 wt. % $MnO_2$ or $Fe_2O_3$. Additionally, borosilicate glasses doped with Cu, Ni, Co, and Fe in high concentrations (greater than about 10%) exhibit detectable non-resonant microwave absorption at zero field. The energy absorption characteristics of these alternative host material/metal ion combinations at zero magnetic field have been known in the art, but never utilized as part of a memory device. Other examples of materials that could be engineered to contain transition metals that could be oxidized/reduced by applied potentials or light to exhibit zero field splitting memory behavior include porphyrins, ferrocenes, and perovskites.

Figure 2:
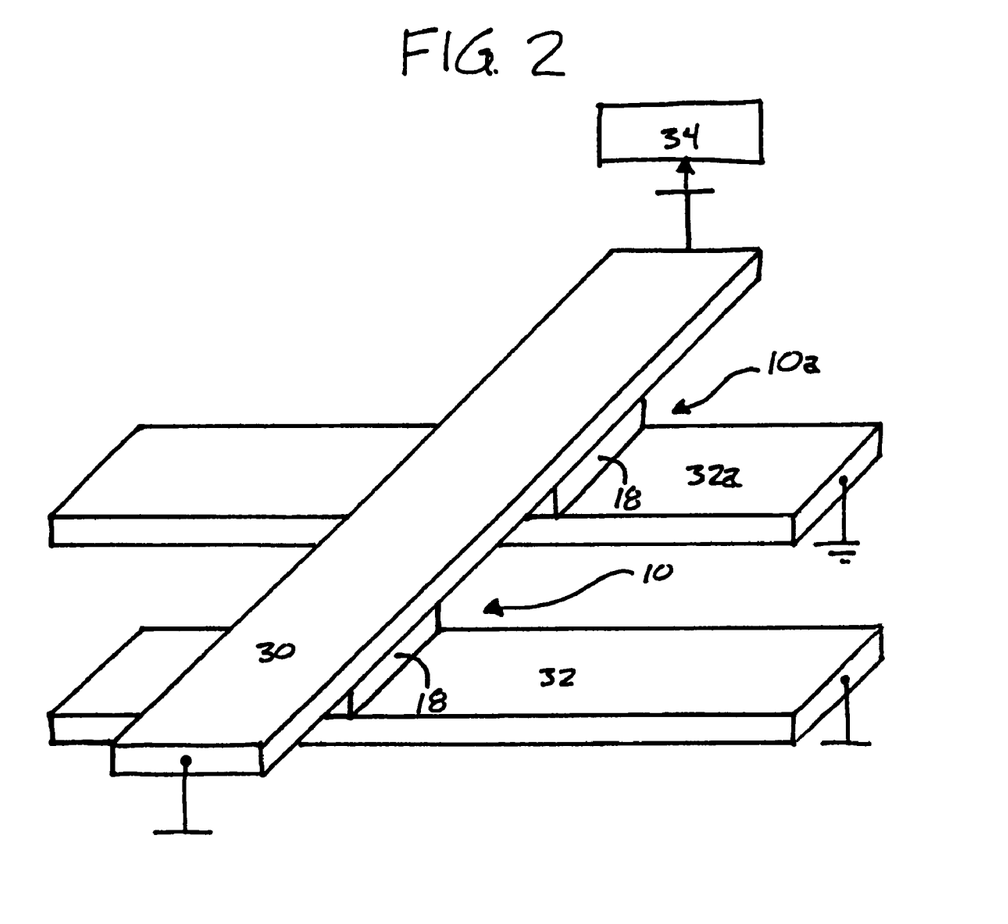
FIG. 2 is a representative portion of a memory array incorporating memory cells, which may be used with the simultaneous read circuit in accordance with the invention.

As shown in FIG. 2, the memory cells 10 of the invention can be utilized in a memory array by being formed between conductive intersecting column lines 30 and row lines 32. At each intersection is located the host material 18 comprising metal ions. When the host material 18 is of the appropriate composition (e.g., the correct matrix material supporting the correct ions and ligands), it can be written, read, and erased in a non-volatile manner for operation as a memory device as discussed herein.

A memory cell in accordance with an exemplary embodiment of the invention stores information as a stable energy absorption state; which is one of two states, the other being a stable non-energy-absorbing state. The energy absorbing property of the memory cell should be sufficient to absorb a detectable amount of an energy (e.g., electrical or optical) impulse at a bandwidth corresponding to the splitting at zero field of the ions in the host material. Energy, bandwidth frequency, and pulse rise time are interrelated variables relating to the programming of the memory cell. These variables are interrelated in general accordance with the following formulas:

$$\text{Bandwidth frequency (Hz)} \approx 0.35/\text{pulse rise time (seconds)} \quad (1a)$$

$$\text{Energy (cm}^{-1}) \approx \text{Bandwidth frequency (Hz)}/3 \times 10^{10} \text{ (cm/s)} \quad (1b)$$

Although the two memory states of the memory cells of the invention have been described as an energy-absorbing state and a non-energy-absorbing state, the invention is not limited to such states. Two energy-absorbing states may also be used, where the amount of energy absorption each state exhibits is great enough for individual detection and also allows effective differentiation between the two states.

Writing (as well as erasing) the memory cells can be accomplished by three phenomena: (1) changing the oxidation state of the metal ions of the cell; (2) changing the ligand field environment of the metal ions; each induced either by using a voltage potential or light impulse; or (3) a combination of (1) and (2). Either of these inducement techniques can change the zero field splitting parameters of the metal ions in a host material 18.

The exemplary memory device of the invention can be written by a potential pulse as already discussed. For example, as shown in FIG. 2, a column line 30 is charged with a programming potential while an intersecting row line 32a is grounded. The memory cell 10a at the intersection of the column line 30 and row line 32a is then programmed (e.g., by redox reaction or ligand field change) to the stable energy-absorbing memory state from a stable non-energy-absorbing state.

The specific mechanism enabling the memory cell to switch between energy-absorbing and non-energy-absorbing states will vary depending upon the way the metal ion is altered. Examples include a change in oxidation state of the ions (e.g., $Mn^{+2}$) within the host material (e.g., $Ge_{40}Se_{60}$) or because of an alteration of the distribution of molecular species within the memory element of the device such that the metal ions are associated with a charged ligand field environment around the ion. Under the oxidation theory, the metal ions of the host material may form a redox pair, such as $Mn^{+2}/Mn^{+3}$, $Cu^{+2}/Cu^{+1}$, or $Fe^{+2}/Fe^{+3}$, which permits energy absorption within the cell. Under the altered ligand theory, the ligand field around the metal ions may undergo a structural change within the memory cell. For example, if a potential applied in a specific direction across the cell causes a rearrangement in the molecular matrix or if the metal ions redistribute non-homogeneously and see more spin-spin interactions (electrons interacting with each other) due to ion proximity, energy absorption can be enabled or disabled within the cell.

Because the memory cell's ability to store data is based on a changeable physical property of the cell, the memory cell can be non-volatile, or at least has very low volatility compared with prior art memory technologies such as DRAM. For example, if the programming mechanism is based on a redox reaction, once the potential applied across the cell generates a larger distribution of one redox state of the metal ions, removal of the potential does not initiate a reverse redox reaction. Likewise, a rearrangement of the molecular matrix remains until another input of energy changes the matrix.

After programming, the memory device can be returned to its original energy absorption state. One method of turning off programmed devices is by applying a reverse voltage potential relative to the programming potential of the stimulation pulse. Another method is by utilizing a light pulse.

The programmed state of a single memory cell can be read, preferably, by sensing the absorption or transmission of energy from a read electrical pulse applied to the cell. After programming a cell to an energy-absorbing state, the metal ions of the cell have a zero field interaction, which results in the metal ions being able to absorb a detectable amount of energy corresponding to the splitting at zero field. If the pulse rise time corresponds to the separation in energy of the electron spin levels at zero field, the signal (or at least a detectable portion thereof) is absorbed by the memory cell and a reduced or absent energy transmission can be sensed by read circuitry. However, if no energy is absorbed because the cell is not programmed to an energy-absorbing state, the energy applied to the cell remains largely intact and can be sensed by read circuitry as corresponding to the non-programmed state of the cell.

The energy pulse rise time of the read signal is selected (in accordance with Equations (1a) and (1b)) so that a non-programmed cell does not affect the pulse, but a programmed cell absorbs at least a detectable amount of the transmitted energy. Pulse rise times are specific to the zero field splitting parameters of the molecular system. Pulse rise times in accordance with the exemplary embodiments of the invention (FIG. 1) described above should be about 350 picoseconds to less than 4 picoseconds in order to correspond to the separation in electron spin level energy at zero field of the metal ions used in the memory cells; $Mn^{+2}$, $Cu^{+2}$, and $Fe^{+2}$ being examples. The memory device's access speed is limited only by the speed of the access electronics.

A single memory cell 10a can be addressed for reading by a read pulse input at the column line 30 (with row line 32a grounded). As the pulse propagates down the column line it is absorbed by the memory cell 10a host material 18 if: (1) the host material 18 is in a zero field splitting state; and (2) the row line 32a at the address is grounded. The memory cell 10a is read by sense circuitry 34 in electrical communication with the column line 30 according to the amount of the column line 30 pulse absorbed by the memory cell 10a.

Figure 3:
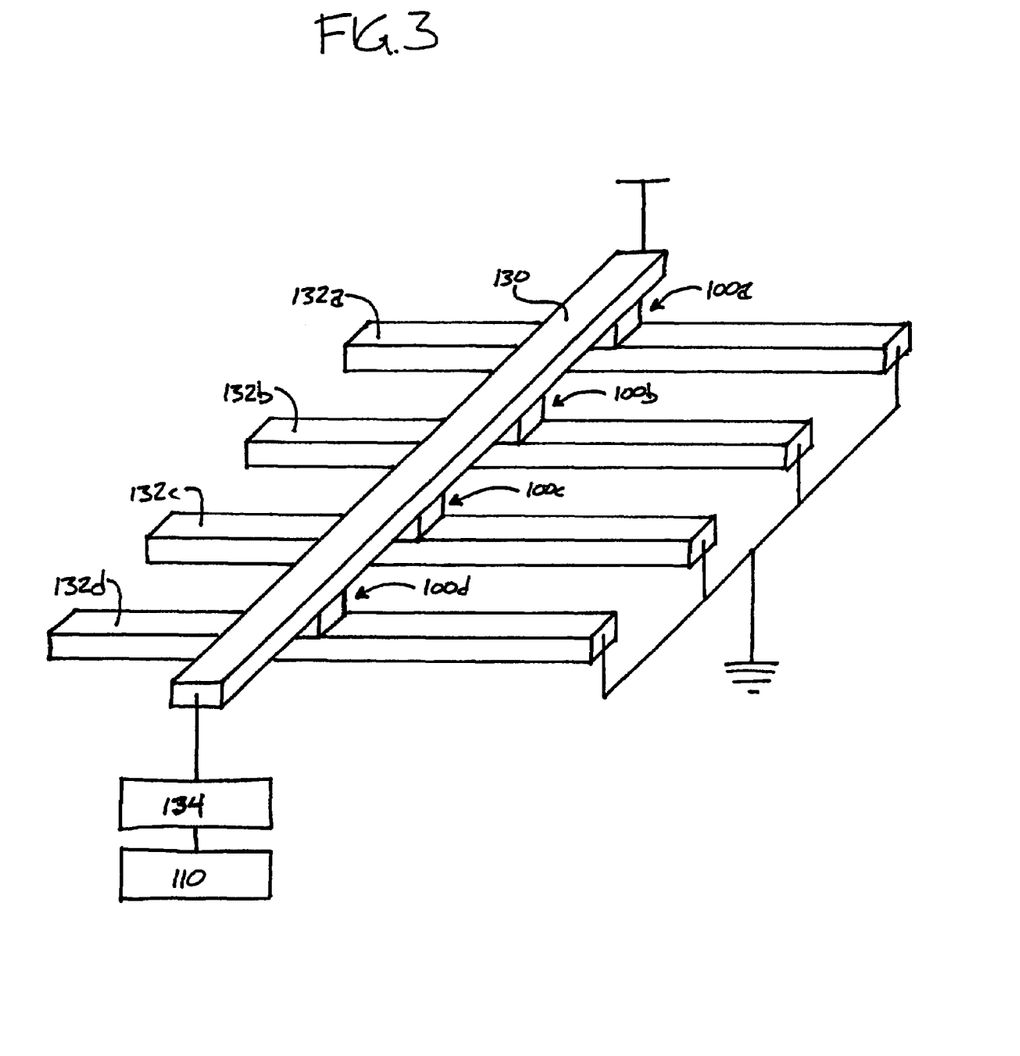
FIG. 3 is a representative portion of a memory array incorporating exemplary embodiments of memory cells in communication with sense circuitry and a fast fourier transform analysis circuit in accordance with the invention.

In accordance with an exemplary embodiment of the invention, as shown in FIG. 3, an plurality of memory cells 100a, 100b, 100c, 100d can be read simultaneously using a fast fourier transform analysis circuit 110 (the individual cells can be programmed as discussed above in reference to FIG. 2). The structure and operation of the individual memory cells, e.g., 100a, of such an embodiment can be like that shown in FIG. 1 and described above. The interconnection of the various cells, e.g., 100a, 100b, 100c, and 100d, is important. The memory cells are interconnected with read circuitry, e.g., a conductive column line 130, so that a read signal propagating down the interconnecting circuitry can interact with each memory cell on the interconnecting line and be received by sense circuitry 134 in electrical communication with the interconnecting circuitry. A fast fourier transform analysis circuit 110 is in electrical communication with the sense circuitry 134. The operation of the fast fourier transform analysis circuit 110 is discussed in the following paragraph. Alternatively to the structure shown in FIG. 3, the interconnecting column line 130 can run parallel (as opposed to orthogonal) to a row line (e.g., 132a) and thereby interconnect the memory cells on that row line with a read circuit. In such an alternative embodiment, only one row line (e.g., 132a) need be grounded for the read operation.

The read operation in accordance with this embodiment begins with an energy pulse being applied at one end of the conductive line (column line 130) in contact with multiple cells 100a, 100b, 100c, 100d. The row lines 132a, 132b, 132c, 132d are grounded. The fast fourier transform analysis circuit 110, in electrical communication with this column line 130 through sense circuitry 134 produces a characteristic pulse-out spectrum in the frequency domain dependent upon how each cell 100a, 100b, 100c, 100d is programmed and each cell's location along the column line 130. The "pulse out" potential shape off the column line 130 depends on the programmed energy absorption state of each memory cell 100a, 100b, 100c, 100d along the column line 130 and has a distinct signature depending on which memory cells are "on" or "off" and the location of each memory cell along the column line 130. Each different combination of "on" and "off" memory cells 100a, 100b, 100c, 100d along the column line 130 will output a unique signature. This embodiment allows all memory cells 100a, 100b, 100c, 100d on a single column line 130 (or on a single row line) to be read simultaneously.

In another embodiment in accordance with the invention, the simultaneous read circuit of the invention can be used with multi-bit zero field splitting resonance memory cells having a host material 18 incorporating multiple transition metal ion species (more than one ion type). The basic structure of such a memory cell 10 can be like that shown in FIG. 1 and described above. However, where the host material 18 of the embodiment described in accordance with FIG. 1 is doped only with one metal ion species, the host material 18 of this embodiment incorporates at least two metal ion species, for example, one ion can be $Mn^{+2}$ and another can be $Cu^{+2}$. Both can be incorporated in a $Ge_{40}Se_{60}$ host material.

This embodiment is capable of multiple oxidation states or multiple configurations which have different zero field splitting parameters. Because each transition metal ion (e.g., ions of Mn, Ti, Co, Cr, Cu, Zn, Ni, Fe, Cd, V, and others) has a different zero field splitting energy in the matrix, each programmed state relating to the different ion types can be accessed for a reading operation using a different electrical energy pulse with a rise time corresponding to the energy splitting of a particular ion. For example, a pulse corresponding to a zero field splitting energy of 0.35 $cm^{-1}$ may be used to read a bit corresponding to $Mn^{+3}$ ions, but a pulse of greater or lesser magnitude and different rise time may be used for reading a bit stored by $Cu^{+2}$, where the latter pulse would have no effect on the bit stored by the $Mn^{+3}$ ion because rise times are coordinated with the different ion species. A single memory cell 10 can therefore contain a plurality of independent memory states, which can each be independently read by changing the rise time of the read pulse. As with other embodiments discussed above, the memory cells 10 of this embodiment can be programmed by either application of a light pulse of a certain wavelength or by application of a potential across the memory cell 10. The ions of different metal species may respond to a programming input with either an oxidation state change or a ligand field rearrangement, as discussed.

In this embodiment, it is possible that programming for an ion species with a higher potential programming needs could affect the programmed state of an ion species with lower potential programming needs. Therefore, there should be an order in programming through the various ion species types that takes this into consideration. It is also possible to use various combinations of electrical and light pulses to program the memory cells. The reading of memory states would be independent because pulse rise times used for reading the various ions of a memory cell would be specific to individual ion types and would have no effect on other ion types since these rise times can be correlated to the zero field splitting energy. Thus, the simultaneous read circuitry; as shown in FIG. 3, can be used with a plurality of multiple bit memory cells by applying read energy pulses corresponding to the various ion species.

Figure 4:
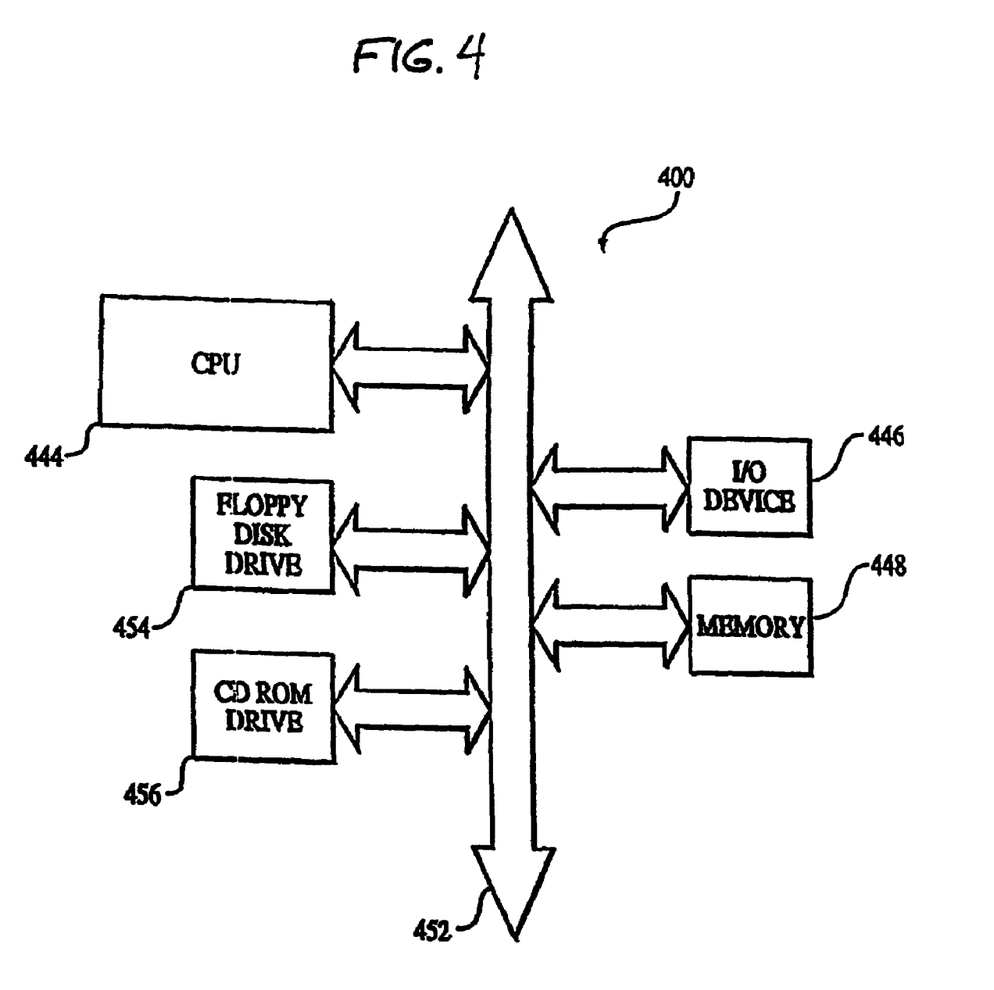
FIG. 4 is a representation of a processor system employing a memory device incorporating exemplary embodiments of memory read circuits in accordance with the invention.

FIG. 4 shows a typical processor-based system 400, which includes a memory circuit 448, for example, a programmable RAM, employing a memory read circuit having memory cells 10 constructed in accordance with the invention as shown in FIG. 3. A processor system, such as computer system, generally comprises a central processing unit (CPU) 444, such as a microprocessor, a digital signal processor, or other programmable digital logic devices. Such devices communicate with an input/output (I/O) device 446 over a bus 452. The memory 448 communicates with the system over the bus 452, typically by a memory controller.

In the case of a computer system, the processor may include peripheral devices, such as a disk drive 454 and a CDROM drive 456, which also communicate with the CPU 444 over the bus 452. Memory 448 is preferably constructed as an integrated circuit, which includes one or more memory devices having memory cells 10. If desired, the memory 448 may be combined with the processor, for example CPU 444, in a single integrated circuit.

The processes and devices described above are merely illustrative of but a few of the preferred methods and devices that could be used and produced in accordance with the invention. The above description and drawings illustrate embodiments, which achieve the objects, features, and advantages of the invention. However, it is not intended that the invention be strictly limited to the above-described and illustrated embodiments. Any modifications of the invention that come within the spirit and scope of the following claims should be considered part of the invention.

What is claimed as new and desired to be protected by Letters Patent of the United States is:

1. A memory read circuit, comprising:
    a plurality of memory cells, each being formed to store data as an energy-absorbing state;
    a conductor line electrically coupled to each of said plurality of memory cells; and
    a fast fourier transform analysis circuit electrically coupled to said conductor line, wherein said plurality of memory cells, said conductor line and said fast fourier transform analysis circuit are connected to simultaneously read data stored in each of said plurality of memory cells in response to a read signal applied to said conductor line.

2. The memory read circuit of claim 1, wherein said memory cells are zero field splitting resonance memory cells.

3. The memory read circuit of claim 1, wherein said memory cells are PCRAM cells.

4. The memory read circuit of claim 1, wherein said memory cells are MRAM cells.

5. The memory read circuit of claim 1, wherein said memory cells are polymer memory cells.

6. The memory read circuit of claim 1, wherein said memory cells are chalcogenide memory cells.

7. The memory read circuit of claim 1, wherein said memory cells are differential negative resistance memory cells.

8. The memory read circuit of claim 1, wherein said memory cells comprise a host material incorporating metal ions, said host material and metal ions being configured to absorb a detectable amount of energy corresponding to a separation in energy of the electron spin levels of said metal ions at zero field.

9. The memory read circuit of claim 8, wherein said host material and said metal ions are configured to absorb about 0.03 $cm^{-1}$ to about 3.3 $cm^{-1}$ when programmed to an energy absorbing state.

10. The memory read circuit of claim 8, wherein said host material and said metal ions are configured to absorb about 0.33 $cm^{-1}$ at a frequency of about 9.68 GHz when a respective memory cell is programmed to said energy-absorbing state.

11. The memory read circuit of claim 1, wherein the configuration of said plurality of memory cells, said conductor line and said fast fourier transform analysis circuit can provide a signature pulse out potential shape during a read operation, said signature pulse out potential shape representing the programmed state of each of said plurality of memory cells.

12. The memory read circuit of claim 11, wherein said signature pulse out potential shape is defined by the programmed state of said plurality of memory cells and the location of each along said conductor line.

13. The memory read circuit of claim 1, wherein said conductor line is a column line.

14. A memory read circuit, comprising:
a plurality of memory cells, each comprising a first electrode and a second electrode electrically coupled to a host material incorporating metal ions, said metal ions exhibiting zero field splitting resonance, said host material and metal ions being formed to store data as an energy-absorbing state and a non-energy-absorbing state;
a conductor line electrically coupled to each of said plurality of memory cells; and
a fast fourier transform analysis circuit electrically coupled to said conductor line, wherein said plurality of memory cells, said conductor line and said fast fourier transform analysis circuit are connected to simultaneously read data stored in each of said plurality of memory cells in response to a read signal applied to said conductor line.

15. The memory read circuit of claim 14, wherein said host material is germanium selenide.

16. The memory read circuit of claim 14, wherein said metal ions comprise $Mn^{+2}$.

17. The memory read circuit of claim 14, wherein said host material is $Ge_{4o}Se_{6o}$ incorporating about 3 wt. % $Mn^{+2}$ as said metal ions.

18. The memory read circuit of claim 14, wherein said host material and said metal ions are configured to absorb a detectable amount of energy corresponding to a separation in energy of the electron spin levels of said metal ions at zero field.

19. The memory read circuit of claim 14, wherein said host material and said metal ions are configured to absorb about 0.03 cm–1 to about 3.3 $cm^{-1}$ when a respective memory cell is programmed to said energy-absorbing state.

20. The memory read circuit of claim 14, wherein said plurality of memory cells are each configured to be programmed to said energy-absorbing state by a light pulse.

21. The memory read circuit of claim 14, wherein said plurality of memory cells are each configured to be programmed to said energy-absorbing state by an electrical pulse.

22. The memory read circuit of claim 14, wherein the configuration of said plurality of memory cells, said conductor line and said fast fourier transform analysis circuit can provide a signature pulse out potential shape during a read operation, said signature pulse out potential shape representing the programmed state of each of said plurality of memory cells.

23. The memory read circuit of claim 22, wherein said signature pulse out potential shape is defined by the programmed state of said plurality of memory cells and the location of each along said conductor line.

24. The memory read circuit of claim 14, wherein said conductor line is a column line.

25. A processor-based device, comprising:
a processor; and
a memory read circuit, comprising:
a plurality of memory cells, each comprising a first electrode and a second electrode electrically coupled to a host material incorporating metal ions, said metal ions exhibiting zero field splitting resonance, said host material and metal ions being formed to store data as an energy-absorbing state and a non-energy-absorbing state;
a conductor line electrically coupled to each of said plurality of memory cells; and
a fast fourier transform analysis circuit electrically coupled to said conductor line, wherein said plurality of memory cells, said conductor line and said fast fourier transform analysis circuit are connected to simultaneously read data stored in each of said plurality of memory cells in response to a read signal applied to said conductor line.

26. The processor-based device of claim 25, wherein said host material is $Ge_{4o}Se_{6o}$ incorporating about 3 wt. % $Mn^{+2}$ as said metal ions.

27. The processor-based device of claim 25, wherein the configuration of said plurality of memory cells, said conductor line and said fast fourier transform analysis circuit can provide a signature pulse out potential shape during a read operation, said signature pulse out potential shape representing the programmed state of each of said plurality of memory cells.

28. The processor-based device of claim 27, wherein said signature pulse out potential shape is defined by the programmed state of said plurality of memory cells and the location of each along said conductor line.

29. A method of simultaneously reading a plurality of memory cells, comprising:
providing a plurality of memory cells, each being programmable to an energy-absorbing state and electrically connected to a conductor line, said conductor line being in electrical communication with a fast fourier transform analysis circuit;
programming at least one of said plurality of memory cells to said energy-absorbing state; and
reading said plurality of memory cells simultaneously by sensing the absorption or transmission of a read energy pulse through each of said plurality of memory cells.

30. The method of claim 29, wherein said memory cells are zero field splitting resonance memory cells.

31. The method of claim 29, wherein said memory cells are PCRAM cells.

32. The method of claim 29, wherein said memory cells are MRAM cells.

33. The method of claim 29, wherein said memory cells are polymer memory cells.

34. The method of claim 29, wherein said memory cells are chalcogenide memory cells.

35. The method of claim 29, wherein said memory cells are differential negative resistance memory cells.

36. The method of claim 29, wherein said reading said plurality of memory cells comprises applying energy to each of said plurality of memory cells without changing the programming of any said memory cell.

37. The method of claim 29, wherein a fast fourier transform analysis circuit is configured to interpret the read energy pulse through said plurality of memory cells as an output signature defined by the programmed state and location on a conductor line of each cell of said plurality of memory cells.

38. A method of simultaneously reading a plurality of memory cells, comprising:
providing a plurality of memory cells, each comprising a host material which incorporates metal ions exhibiting zero field splitting resonance;

interconnecting said plurality of memory cells with a conductor line in electrical communication with a fast fourier transform analysis circuit;

programming at least one cell of said plurality of memory cells to an energy-absorbing state corresponding to a separation of spin states of said metal ions at zero magnetic field; and reading said plurality of memory cells simultaneously by sensing the absorption or transmission of a read energy pulse through said host material of said plurality of memory cells.

39. The method of claim 38, wherein said host material comprises $Ge_{4o}Se_{6o}$ glass.

40. The method of claim 38, wherein said metal ions comprise $Mn^{+2}$.

41. The method of claim 38, wherein said reading said plurality of memory cells comprises applying energy to said host material of each memory cell of said plurality of memory cells in the microwave frequency range.

42. The method of claim 38, wherein said reading said plurality of memory cells comprises applying an energy pulse to said host material of at least about $0.03$ $cm^{-1}$ at a frequency of about 9.68 GHz with a risetime of about 200 picoseconds.

43. The method of claim 38, wherein said fast fourier transform analysis circuit is configured to interpret the read energy pulse through said plurality of memory cells as an output signature defined by the programmed state and location on said conductor line of each memory cell of said plurality of memory cells.

44. A method of simultaneously reading a plurality of memory cells, comprising:

providing a plurality of memory cells, each comprising $Ge_{4o}Se_{6o}$ glass incorporating $Mn^{+2}$ ions, each said memory cells being configured to exhibit zero field splitting resonance;

interconnecting said plurality of memory cells with a conductor line in electrical communication with a fast fourier transform analysis circuit;

programming at least one of said plurality of memory cells to an energy-absorbing state corresponding to a separation of spin states of said metal ions at zero magnetic field; and reading said plurality of memory cells simultaneously, said reading comprising:

applying energy in the microwave frequency range to said host material of each memory cell of said plurality of memory cells without changing the programming of any said memory cell, interpreting the absorption or transmission of said energy through said host material of said plurality of memory devices, and utilizing said fast fourier transform analysis circuit to produce an output signature defined by the programmed state and location on said conductor line of each of said plurality of memory devices.

* * * * *

UNITED STATES PATENT AND TRADEMARK OFFICE
CERTIFICATE OF CORRECTION

PATENT NO. : 7,366,030 B2  Page 1 of 1
APPLICATION NO. : 10/766010
DATED : April 29, 2008
INVENTOR(S) : Campbell et al.

It is certified that error appears in the above-identified patent and that said Letters Patent is hereby corrected as shown below:

In column 11, line 32, in Claim 17, delete "$Ge_{4o}Se_{6o}$" and insert -- $Ge_{40}Se_{60}$ --, therefor.

In column 11, line 41, in Claim 19, delete "cm-1" and insert -- $cm^{-1}$ --, therefor.

In column 12, line 16, in Claim 26, delete "$Ge_{4o}Se_{6o}$" and insert -- $Ge_{40}Se_{60}$ --, therefor.

In column 13, line 13, in Claim 39, delete "$Ge_{4o}Se_{6o}$" and insert -- $Ge_{40}Se_{60}$ --, therefor.

In column 14, line 4, in Claim 44, delete "$Ge_{4o}Se_{6o}$" and insert -- $Ge_{40}Se_{60}$ --, therefor.

Signed and Sealed this

Fifteenth Day of July, 2008

JON W. DUDAS
*Director of the United States Patent and Trademark Office*